United States Patent [19]
Alexander

[11] 3,965,465
[45] June 22, 1976

[54] SELF TIMING SWITCH
[76] Inventor: Jerry L. Alexander, St. Paul Park, Minn. 55071
[22] Filed: May 16, 1974
[21] Appl. No.: 470,537

[52] U.S. Cl. .................. 340/274 R; 200/DIG. 1; 307/125; 240/2.13; 340/258 C
[51] Int. Cl.² .................. G08B 13/26; E05B 17/10
[58] Field of Search .................. 340/274 R, 258 C; 240/2.13; 307/125, 294; 200/DIG. 1, 61.62, 61.58 R; 328/5, 77

[56] References Cited
UNITED STATES PATENTS

| | | | |
|---|---|---|---|
| 2,637,801 | 5/1953 | Kelley et al. | 240/2 |
| 2,767,303 | 10/1956 | Rommey et al. | 240/2.13 |
| 3,508,239 | 4/1970 | Fontaine | 340/258 |
| 3,771,152 | 11/1973 | Dettling et al. | 340/258 C |
| 3,824,576 | 7/1974 | Pioch | 340/274 |
| 3,829,850 | 8/1974 | Guetersloh | 340/258 C |

OTHER PUBLICATIONS

Imperial Inventors International, Inc., File No. R-777F, "Touch Alarm Switch, T.A.S. 100", Dated 11, Sept. 1973.
Heater, J. Courtenay, "Monolithic Timer Makes Convenient Touch Switch", Electronic Design News, Dec. 1, 1972, p. 55.
Hnatek, Eugene R., "Put the IC Timer to Work in a Myriad of Ways", Electronic Design News, Mar. 5, 1973, pp. 54–58.
Nunley, Jay, "Touch-Plate Power Switch", Popular Electronics, Aug., 1972, pp. 50–53.
Magic Dot, Inc., "Touch Switch Works Remotely", Electronics, Mar., 29, 1973, p. 100.
Baird, Robert D., "Intruder Alarm is Based on Electrostatic Charge Detection", Electronic Design, Apr. 26, 1973, p. 192.
Hoberman, Stu, "Touch Module – This New Version Does Many Jobs", Popular Science, Feb. 1973, pp. 124-125.

*Primary Examiner*—Glen R. Swann, III
*Attorney, Agent, or Firm*—William L. Huebsch

[57] ABSTRACT

A switch adapted to fit into a conventional switch box controls an entryway light of a building. The switch is connected to a conductive latch in a door controlling access to the entryway to receive the minute electrical charge carried by a person attempting to operate the latch. Upon being triggered by such a charge, the switch will turn on the light for a predetermined time to provide a convenience for those authorized to enter, and a deterrent for those who are not.

10 Claims, 5 Drawing Figures

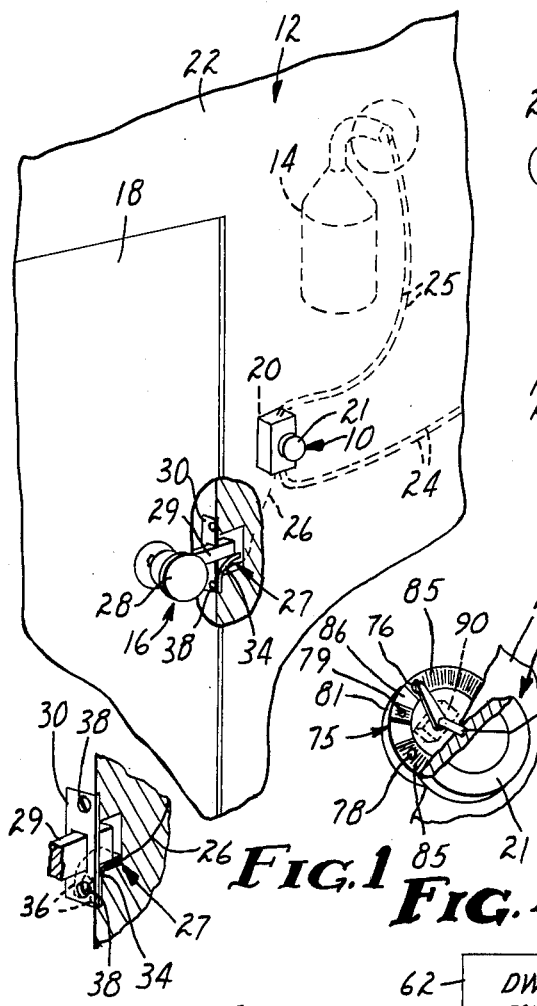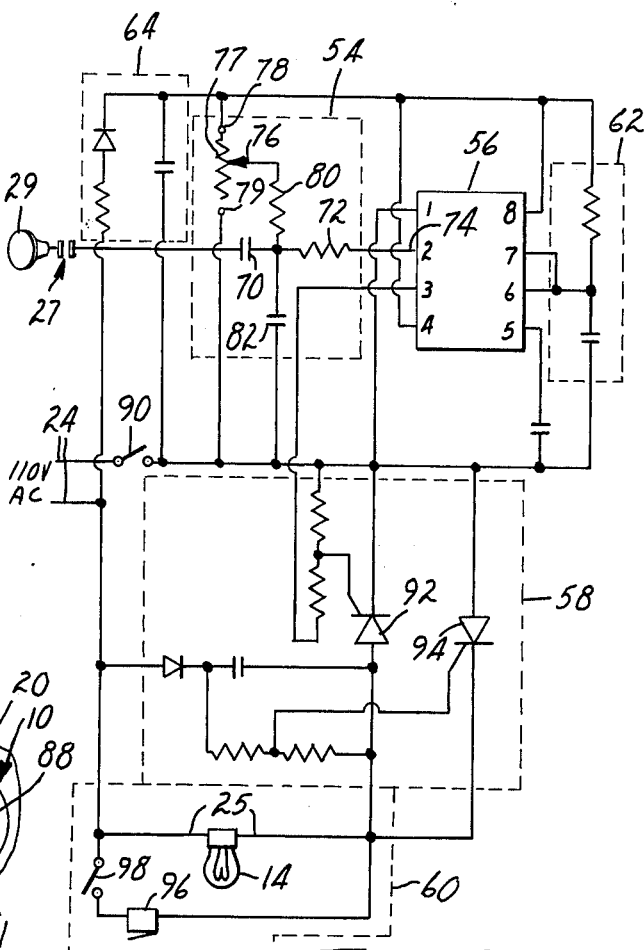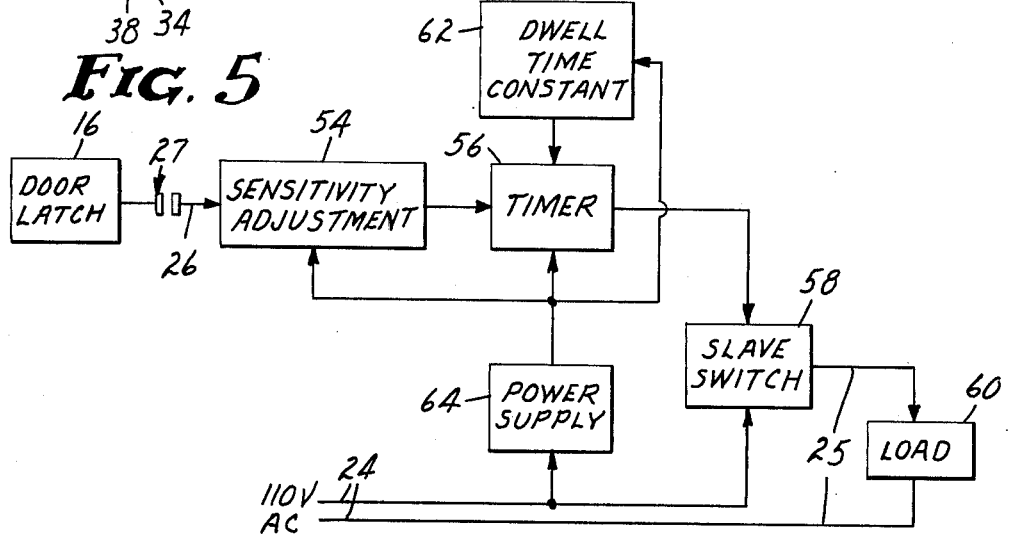

SELF TIMING SWITCH

BACKGROUND OF THE INVENTION

This invention relates to switching systems, and in one aspect to a switching system adapted to control a light in an entryway.

Switching Systems adapted to actuate an entryway light for a predetermined time upon operation of the door latch are known. U.S. Pat. No. 2,637,801 suggests such a switching system of U.S. Pat. No. 2,637,801, however, the entryway light is only activated by operation of the latch mechanism or by manual operation of one or more switches. The system requires a specially constructed latch which is not easily substituted for conventional latches to modify existing entryway doors, and installation of the system requires that house voltage wiring be extended to the latch.

SUMMARY OF THE INVENTION

The present invention provides a switch or switch assembly particularly adapted to control the entry light for a building. The switch may be connected to activate the entry light for a predetermined period of time when the minute static electrical charge normally carried by a person is transferred to the door latch in the entryway, as when the person touches the door knob or inserts his key in the lock. Thus, unlike the device of U.S. Pat. No. 2,637,801, the entry light is activated prior to the release of the door latch. This provides a convenience for authorized persons leaving or entering the building, and a deterrent to unauthorized persons prior to their having gained access to the building.

The switch is particularly adapted for use in modifying entry light switching systems for buildings of the usual type comprising a light positioned to illuminate the outer surface of the door, which light is controlled from a conventional on-off switch accessible from the inner surface of the building adjacent the door. The switch according to the present invention is adapted to physically replace the conventional on-off switch in such a system. Besides switch replacement, such modification requires only the installation of a contact means in the door frame for making electrical contact with conductive portions of the latch member on the door when the door is latched, and the connection of a small signal wire between the contact means and the switch.

Generally the switch assembly includes (1) a known integrated circuit timer or switch means coupled to novel specially selected external components and powered by house voltage power, which timer is adapted for being switched from a first state to a second state when an electrical activation signal is applied to an input to the timer and for providing an output signal when in the second state, (2) a network coupled to the input to the timer and adapted to be coupled to the conductive latch, the network comprising the contact means and means for compensating for environmental changes to preclude false alarms and for providing a triggering signal to activate the timer when a person contacts the conductive latch, (3) a dwell-time-constant network coupled to the timer for controlling the time during which the timer remains in the second state, and (4) a slave switching means coupled to receive the output signal for applying or restricting the transfer of electrical power to a load, such as an electric light, so long as the output signal is received.

Preferably the sensitivity adjust network includes a special control which is manually operable to provide both (1) adjustment of the threshold level of the static electrical input signal which will cause the switch to operate the light for a predetermined time to compensate for varying levels of static electrical inputs caused by environmental changes, and (2) a means for providing an input signal to the timer so that the light can be continuously activated.

The control can be conveniently provided by modifying a conventional potentiometer of the type having a resistive surface extending between two end terminals and a contact member adapted to be manually moved along the resistive surface. The modification consists of interrupting the resistive surface proximate one end terminal to provide for the contact an electrically nonconductive path portion spacing a resistive path portion from the second terminal. The first terminal is connected to a source of positive potential, the second terminal is connected to a source of negative potential, and the contact member is electrically coupled to the circuit which conducts the activation signal from the door latch to the timer. The timer is adapted to be switched from its first state to its second state in response to a negative activation signal. Thus positioning the contact member along the resistive surface portion will apply a positive bias voltage to the activation signal for the timer, which positive bias voltage may be varied by changing the position of the contact member therealong so that the negative static electrical charges applied to the door latch (which vary in magnitude for various entryways and under varying atmospheric conditions) can be biased to a proper level for activation of the timer; and positioning the contact member at the second terminal will provide a negative activation signal so that the timer will continuously operate the light.

BRIEF DESCRIPTION OF THE DRAWING

The present invention will be further described with reference to the accompanying drawing wherein like numbers refer to like parts in the several views, and wherein:

FIG. 1 is a fragmentary perspective view of a switch according to the present invention installed to control the entry light for a building, and having parts thereon away to show detail;

FIG. 2 is a block diagram showing the functional portions of the switch according to the present invention;

FIG. 3 is a detailed circuit diagram of one embodiment of a switch according to the present invention;

FIG. 4 is a fragmentary enlarged view of a special control in the switch assembly of FIG. 1; and FIG. 5 is a fragmentary enlarged view showing a contact means used with the switch assembly of FIG. 1.

DESCRIPTION OF THE PREFERRED EMBODIMENT

Referring now to FIG. 1 there is shown a switch assembly or switch 10 according to the present invention installed in an entryway for a building 12 which may be manually manipulated to provide on-off control of an entry light 14 in the conventional manner, and which may be set to operate the entry light 14 for a predetermined time after a person touches a conventional conductive latch 16 for a door 18 in the entryway.

The switch 10 is housed in a conventional switch box 20 adjacent the door 18, and includes a knob 21 which affords manual selection and/or adjustment of the various functions of the switch 10, and is accessible from an inner surface 22 of a wall in the building 12. The switch 10 is connected between a pair of electrical leads 24 carrying normal house voltage power from a source (not shown) and a pair of leads 25 which can carry the power to the light 14. Additionally, the switch 10 is electrically connected to the conductive latch 16 via a single lead 26 and contact means 27 installed in the wall in a position for contact by the latch 16 to complete electrical contact between the switch 10 and the latch 16 when the door 18 is closed. Thus the conductive latch 16, contact means 27 and lead 26 provide means for transferring a static electrical charge normally carried by a person to provide an activation signal at the switch 10 when that person makes electrical contact with the latch 16, either directly or capacitively, as by touching its doorknob 28 or inserting a key with the bare or gloved hand.

The contact means 27 illustrated is particularly adapted for making a positive electrical contact with a conventional latch 16 of the type comprising a conductive bolt 29 movably mounted in the door 18 which may be manually driven by rotation of a conductive driving member such as the doorknob 28 illustrated or a lock cylinder (not shown) between a retracted position within the door 18, and a position extended from the door 18. In its extended position, with the door 18 closed, the bolt 29 will project through an opening in a metal keeper 30 in the wall and secure the door 18.

The contact means 27 comprises a thin, conductive, flexible, resilient flat plate 34 such as of phosphor bronze. The plate 34 is slotted from one edge to provide spaced fingers 36 which can project and be clamped between the keeper 30 and wall on opposite sides of one of the attachment screws 38 for the keeper 30 to position the end of the plate 34 opposite the fingers partially across the opening in the keeper 30. In this position the plate 34 will be deflected by the bolt 29 as it enters the keeper 30, and will remain mechanically biased against the bolt 29 to provide an efficient electrical contact therewith. One end of the lead 26 is wrapped around the attachment screw 38 between the fingers 36 and pressed against the plate 34 by pressure applied by the attachment screw 38 to make electrical contact therewith to transfer static electricity received through the bolt 29 and plate 34 to the switch 10.

The essential elements of the switch 10 are shown in the block diagram of FIG. 2. The electrically conductive door latch 16 provides a touch member which is positioned for ready electrical contact to receive the minute static electrical charge carried by a person. The door latch 16 is adapted to transfer such a charge as an activation signal via the contact means 27 to the remainder of the switch 10. The activation signal is coupled through a sensitivity adjust network 54 which provides an electrical bias to control the intensity of the activation signal received at the latch 16 which is required to activate the switch 10. Such control is desirable in order to compensate for various electrical characteristics of the entryway and environmental changes that will affect the amount of static charge normally carried by a person and thereby set the level of activation signal required for the switch 10 to preclude false alarms.

The biased activation signal is coupled to a timer 56 which is controllably switched from a first stable state to a second quasi-stable state in response to the activation signal. The output of the timer 56 is coupled to a slave switch 58 to control the application of electrical power to a load 60 such as the electric light 14, or a remote or local electrically operated alarm. A dwell-time-constant network 62 is also coupled to the timer 56 to control the duration the timer 56 remains in the second quasi-stable state (i.e., to control; the duration that electrical power is applied to the load 60). In the embodiment depicted in FIG. 2, the sensitivity adjust network 54, timer 56 and dwell-time-constant network 62 are desirably operated from a low voltage source 64 which in turn is energized from the same electrical power source used to energize the load 60.

FIG. 3 is a detailed circuit diagram of a preferred embodiment of the switch 10 which was generally shown in FIG. 2. The timer 56 is preferably a monolithic integrated circuit timer such as a Signetics Corp. NE/SE555. An activation signal from the door latch 16 is coupled to an input terminal 74 of the timer 56 through a capacitor 70 and resistor 72 to ensure the absence of any electrical shock hazard at the door latch 16 as could occur in the event of unexpected electrical failure.

A controlled DC voltage is also coupled to the input 74 of the timer 56 through the resistor 72. The voltage is developed as an output of the sensitivity adjust network 54. The sensitivity adjust network 54 includes a special manually operable control 75 including a movable contact 76 which can be manually set to contact either (1) a variable resistor 77 connected to a positive DC voltage at a first terminal 78 to provide a desired level of positive bias voltage to adjust the sensitivity of the switch 10 to negative static electrical activation signals; or (2) a second terminal 79 connected to a negative DC voltage to provide a negative input signal which will continuously activate the switch 10. The movable contact 76 is connected to the resistor 72 through a resistor 80 and also to a capacitor 82, which latter two components filter out line voltage transients as could otherwise undesirably activate the timer 56.

Preferably the special control 75 is made by modifying a conventional potentiometer to cause an incomplete electrical circuit between its two end terminals. As illustrated in FIG. 1 a commercial potentiometer having resistive surface coating on an annular insulating substrate 81, which coating is adapted to be contacted over a path thereon by an end of the pivotal contact 76, may be desirably altered by scraping the resistive coating off the substrate 81 proximate the second end terminal 79. This provides on the substrate 81 a resistive surface portion 85 for the contact 76 which provides increasing electrical resistance (i.e., a variable resistor) between the first terminal 78 and an electrically non-conductive surface portion 86. The non-conductive surface portion 86 spaces the resistive surface portion 85 from the second terminal 79, which terminal 79 is connected to the negative side of the DC supply voltage.

Accordingly, when the contact 76 is positioned on the resistive surface portion 85 which is connected to the positive side of the DC supply voltage, a positive DC bias voltage is coupled to the input 74 of the timer 56, to offset negative activation signals and increase the intensity of negative signals required to activate the timer 56. Alternatively, since a negative DC voltage applied to the input 74 will continuously activate the timer 56, and maintain it in its second state indefinitely, as may be desirable when the light 14 is to be continuously energized, the adjustable contact 76 may be positioned to contact the second terminal 79, thereby coupling the negative voltage to the input 74 to sustain the second state of the timer 56.

The special control 75 also includes a shaft 88 supporting the knob 21 which is axially slidable between an inner position at which the end of the shaft 88 opposite the knob 21 contacts and moves an on-off switch 90 to its off position to disconnect power to the switch 10 and light 14; and an outer position at which the on-off switch 90 is positioned in its on position to activate the switch 10.

The dwell-time-constant network 62 is coupled to additional inputs of the timer 56 and comprises an RC time constant circuit connected across the DC supply voltage. The respective members of the circuit are selected in order to control the application of a given positive voltage to the additional inputs, which application in the absence of an activation signal causes the timer 56 to revert to its first state. The time constant of the network 62 is accordingly selected to control the duration of the second quasi-stable state, such as for a period of two minutes.

The output of the timer 56 is coupled to the slave switch 58 which may be any variety of electromechanical relays or solid state analogs thereof. In the embodiment shown in FIG. 3, the output of the timer 56 is applied to the gate of an SCR 92 to thereby couple an AC supply voltage to the light 14 during one-half of the AC period. When the SCR 92 is so switched, a similar gating singal is produced to switch on the oppositely connected SCR 94, thereby maintaining the application of AC power across the light 14 during the other one-half period. Upon termination of the output signal from the timer 56, the reverse voltage across the first SCR 92 during the other one-half period will cause the first SCR 92 to stop conducting, which in turn removes the gate signal from the second SCR 94 and removes the AC supply voltage from the light 14.

A DC power supply 64 provides the aforementioned DC supply voltage, by rectifying and filtering the AC supply in a conventional manner.

An audible alarm or buzzer 96 in series with a manually operable on-off switch 98 may also be connected in parallel with the light 14 to provide, when desired, an audible signal when the light 14 is activated. The buzzer 96 and switch 98 are preferably located on the switch 10 with the on-off switch 98 readily accessible on the face thereof.

Installation of an electrical system according to the present invention in a conventional building entryway such as that illustrated in FIG. 1 is easily done by (1) replacing the conventional off-on switch in the switch box 20 with the switch 10 by connecting leads from the switch to the power lines 24 and 25 in the conventional manner; (2) loosening the attachment screws 38 for the keeper 30; (3) slipping the plate 34 between the keeper 30 and the door frame with its fingers 36 on either side of one attachment screw 38; (4) wrapping one end of the lead 26 around the attachment screw 38 between the fingers 36 and keeper 30; (5) tightening the attachment screws 38; and (6) connecting the end of the lead 26 opposite the plate 34 to the switch preferably by boring a hole to pass the wire internally through the wall, or alternatively by passing the wire along the inner surface 22 of the wall.

As may best be seen in FIG. 1, the knob 21 on the installed switch 10 can be rotated to a position with the movable contact 76 on the resistive surface portion 85 so that the light 14 will be activated for a predetermined time when a person touches the conductive door latch 16, as has already been explained. The position of the movable contact 76 on the resistive surface portion 85 which provides a minimum sensitivity to insure proper touch operation of the light 14 is determined by grasping the doorknob 28 with two fingers and the thumb of a gloved hand, and rotating the switch knob 21 to move the movable contact 76 away from the first terminal 78 until the light 14 is activated. This position of the switch knob 21 will insure proper operation of the light 14 even by persons wearing gloves.

Alternatively, the switch knob 21 can be rotated to bring the movable contact 76 with the second terminal 79 to provide a continuous negative input signal to the timer 56 and continuously activate the light 14; or the switch knob 21 can be moved axially to its inner position to turn off the power switch 90, thus affording more conventional operation of the light 14.

I claim:

1. An electrical switch device for controllably energizing load comprising:
    timing means adapted for being switched from a stable state to a quasi-stable state in response to a negative activation signal and for providing an output signal when in said quasi-stable state;
    a dwell-time-constant network coupled to said timing means for controlling the time during which said timing means remains in said quasi-stable state;
    slave switching means coupled to receive said output signal for controlling the application of electrical power to a said load;
    a manually operable sensitivity adjust network coupled to said timing means and comprising means for selectively controlling the intensity of a said activation signal needed to switch said timing means and means for providing a negative activation signal for said timing means to continuously activate said timing means, said sensitivity adjust network including a control comprising:
    a support having a surface extending between a first terminal connected to a source of positive voltage, and a second terminal coupled to a source of negative voltage, said surface comprising a non-conductive surface portion proximate said second terminal, and a resistive surface portion between said first terminal and said non-conductive surface portion; and
    a contact coupled to provide at least a portion of a said activation signal and being manually movable along said surface between said terminals so that when said contact is on said second terminal a negative activation signal is provided to cause said timing means to remain in said quasi-stable state, and when said movable contact is contacting said resistive portion a positive bias is provided to ensure that only an activation signal of a predetermined negative value will switch said timing means to said quasi-stable state; and
    power supply means energized by said electrical power for energizing said timing means, said sensitivity adjust network and said dwell-time-constant network.

2. An electronic switch according to claim 1, wherein said switch further includes buzzer means for providing an audible output upon electrical activation, and an on-off switch connected in series with said buzzer means, said buzzer means and on-off switch combination being adapted to be electrically connected in parallel with said load for activation by said slave switching means.

3. An electronic switch according to claim 1, wherein said timing means is a monolithic integrated circuit timer.

4. An electrical switch according to claim 1, wherein said entire switch has a size of not greater than 1-13/16 inches wide, 2¾ inches tall and 2⅜ inches deep so as to be received by the opening in a conventional single switch box.

5. A switch assembly adapted to control an electric light for illuminating the entryway to a building said entryway comprising a wall, a door mounted in said wall for movement between an open and a closed position, and conductive latch means for releasably securing said door in said wall; wherein said switch assembly is adapted for mounting in a conventional switch box positioned in said wall adjacent said door and said switch assembly includes:

switch means for being switched from a first state to a second state when an activation signal is applied at an inout to said switch means and for providing an output signal when in said second state;

a network coupled to the input to said switch means and adapted to be coupled to said conductive latch means, said network comprising:

contact means adapted for installation in said wall in a position for contact by said latch means to complete electrical contact between said latch means and said switch means when said door is closed to transfer electrical signals from said conductive latch to the input to said switch means; and means for compensating for environmental changes to preclude false alarms and for providing a triggering signal to activate the switch means when a person contacts said conductive latch means;

means coupled to said switch means for contolling the time during which said switch remains in said second state;

means coupled to receive said output signal and adapted for controlling the application of electrical power to a said electric light; and means for energizing said switch means, said network and said means for controlling the time.

6. A switch assembly according to claim 5 wherein said network comprises a sensitivity adjust network for applying a bias voltage at the input to said switch means, said sensitivity adjust network including a manually adjustable control adapted to adjust said bias voltage to a level for compensating for environmental changes to preclude false alarms while passing a triggering signal when a person contacts said conductive latch.

7. A switch assembly according to claim 6, wherein said switch means is adapted for being switched from said first state to said second state in response to a negative activation signal, and said manually adjustable control includes means for providing a negative activation signal at the input to said switch means to continuously activate said switch means, said manually adjustable control comprising:

a support having a surface extending between a first terminal connected to a source of positive voltage, and a second terminal coupled to a source of negative voltage, said surface comprising a non-conducting surface portion proximate said second terminal, and a resistive surface portion between said first terminal and said non-conductive surface portion; and a contact coupled to the input to said switch means and being manually movable along said surface between said terminals so that when said contact is on said second terminal a negative activation signal is provided to cause said timing means to remain in said second state, and when said movable contact is contacting said resistive portion a positive bias is provided at the input to said switch means to restrict activation of said switch means by negative noise signals and to ensure that only an activation signal of a predetermined negative value will switch said switch means to said second state.

8. A switch assembly according to claim 5, wherein said contact means comprises a thin, conductive, flexible resilient flat plate having a first end adapted to be fastened between a keeper for said latch and said wall to position a second end of said plate across an opening in said keeper for contact by a bolt of said conductive latch when the door is closed and the bolt is in an extended position within the opening of the keeper.

9. A switch assembly according to claim 5, wherein said switch assembly includes means adapted for providing an audible output upon electrical activation, and an on-off switch connected in series with said audble output means, said audible output means and on-off switch combination being electrically connected for activation by said means for controlling the application of electric power.

10. A switch assembly according to claim 5, wherein said switch means is a monolithic integrated circuit timer.

* * * * *

UNITED STATES PATENT AND TRADEMARK OFFICE
CERTIFICATE OF CORRECTION

PATENT NO. : 3,965,465
DATED : June 22, 1976
INVENTOR(S) : Jerry L. Alexander

It is certified that error appears in the above—identified patent and that said Letters Patent are hereby corrected as shown below:

Column 1, line 11, after "system" insert --. With the switching system --.

Column 2, line 45, change "thereon" to -- broken --.

Column 4, line 7, delete the "semicolon"; and line 11, after "low" insert -- DC --.

Column 5, line 31, change "singal" to -- signal --.

Column 6, line 15, after "contact 76" insert -- into contact --.

Column 6, line 23, after "gizing" insert -- an electrical --.

Column 7, line 3, after "with" insert -- a --.

Column 8, line 44, change "audble" to -- audible --.

Signed and Sealed this

Twenty-third Day of November 1976

[SEAL]

Attest:

RUTH C. MASON
Attesting Officer

C. MARSHALL DANN
Commissioner of Patents and Trademarks